United States Patent [19]

Rodgers

[11] Patent Number: 4,609,878
[45] Date of Patent: Sep. 2, 1986

[54] NOISE REDUCTION SYSTEM

[75] Inventor: Robert L. Rodgers, Dallas, Tex.

[73] Assignee: Circuit Research Labs, Inc., Tempe, Ariz.

[21] Appl. No.: 761,656

[22] Filed: Jul. 31, 1985

Related U.S. Application Data

[63] Continuation of Ser. No. 460,319, Jan. 24, 1983, abandoned.

[51] Int. Cl.$^4$ ............................................... H03G 9/02
[52] U.S. Cl. .................................... 330/136; 330/149; 330/305; 381/29; 381/94; 381/106
[58] Field of Search ............... 330/136, 149, 279, 305, 330/306; 333/14; 381/29, 30, 94, 106, 120

[56] References Cited

U.S. PATENT DOCUMENTS

| | | | |
|---|---|---|---|
| 3,732,371 | 5/1973 | Burwen | 333/14 X |
| 3,815,039 | 6/1974 | Fujisawa et al. | 330/149 X |
| 3,980,964 | 9/1976 | Grodinsky | 330/149 X |
| 4,136,314 | 1/1979 | Blackmer et al. | 333/14 X |
| 4,169,219 | 9/1979 | Beard | 333/14 X |
| 4,250,470 | 2/1981 | Szarvas | 333/14 |

OTHER PUBLICATIONS

Blackmer, "A Wide Dynamic Range Noise Reduction System," reprinted from DB, Aug.–Sep. 1972, vol. 6, No. 8.
Gorin, "Hi-Fi, Noise Filter/Range Expander", Radio-Electronics, Mar. 1981, pp. 41-44, 110.

Primary Examiner—James B. Mullins
Attorney, Agent, or Firm—Kanz, Scherback & Timmons

[57] ABSTRACT

A noise reduction system including a signal path (34) between an input terminal (12) and an output terminal (36), a voltage control amplifier (38) and a control path (40) between the input terminal and the voltage control amplifier is disclosed. A nonlinear element such as a voltage squarer (32) is in the controlled path. In one arrangement, the control path also includes a signal level detector (22), a one-pole high pass filter (16) and a direct current level shifter (26). A precision diode (30) is interposed in the control path between the direct current level shifter and the signal squarer. One form of the noise reduction system includes a voltage-controlled low pass filter (20) interposed in the signal path between the input terminal and the voltage-controlled amplifier. A weighing control path (46) provides the control signal for the voltage-controlled low pass filter. A two-pole high pass filter (18) followed by a level sensor (48) is interposed in the weighting control path.

19 Claims, 4 Drawing Figures

| INPUT LEVEL AT 12 (1 KHz) | OUTPUT OF 22 | OUTPUT OF 26 WHEN SHIFTED BY 1.5VDC | OUTPUT OF 30 | OUTPUT OF 32 | GAIN REDUCTION IN VCA 38 | SIGNAL OUTPUT LEVEL AT 36 |
|---|---|---|---|---|---|---|
| 0 dBV = .775VRMS dBV | VDC | VDC | VDC | VDC | dB | dBM |
| +20 | -1.0 | -2.5 | 0 | 0 | 0 | +20 |
| +10 | -0.5 | -2.0 | 0 | 0 | 0 | +10 |
| 0 | 0 | -1.5 | 0 | 0 | 0 | 0 |
| -10 | +0.5 | -1.0 | 0 | 0 | 0 | -10 |
| -20 | +1.0 | -0.5 | 0 | 0 | 0 | -20 |
| -30 | +1.5 | 0 | 0 | 0 | 0 | -30 |
| -40 | +2.0 | +0.5 | +0.5 | 0.15 | 3 | -43 |
| -50 | +2.5 | +1.0 | +1.0 | 0.60 | 12 | -62 |
| -60 | +3.0 | +1.5 | +1.5 | 1.35 | 27 | -87 |
| SAME | SAME | OUTPUT OF 26 WITH NO DC SHIFT | SAME | SAME | SAME | SAME |
| +20 | -1.0 | -1.0 | 0 | 0 | 0 | +20 |
| +10 | -0.5 | 0.5 | 0 | 0 | 0 | +10 |
| 0 | 0 | 0 | 0 | 0 | 0 | 0 |
| -10 | +0.5 | +0.5 | +0.5 | 0.15 | 3 | -13 |
| -20 | +1.0 | +1.0 | +1.0 | 0.60 | 12 | -32 |
| -30 | +1.5 | +1.5 | +1.5 | 1.35 | 27 | -57 |
| -40 | +2.0 | +2.0 | +2.0 | 2.40 | 48 | -88 |
| -50 | +2.5 | +2.5 | +2.5 | 3.75 | 75* | -125* |
| -60 | +3.0 | +3.0 | +3.0 | 5.40 | 108* | -168* |

\* - THEORETICAL VALUES

*Fig. 3*

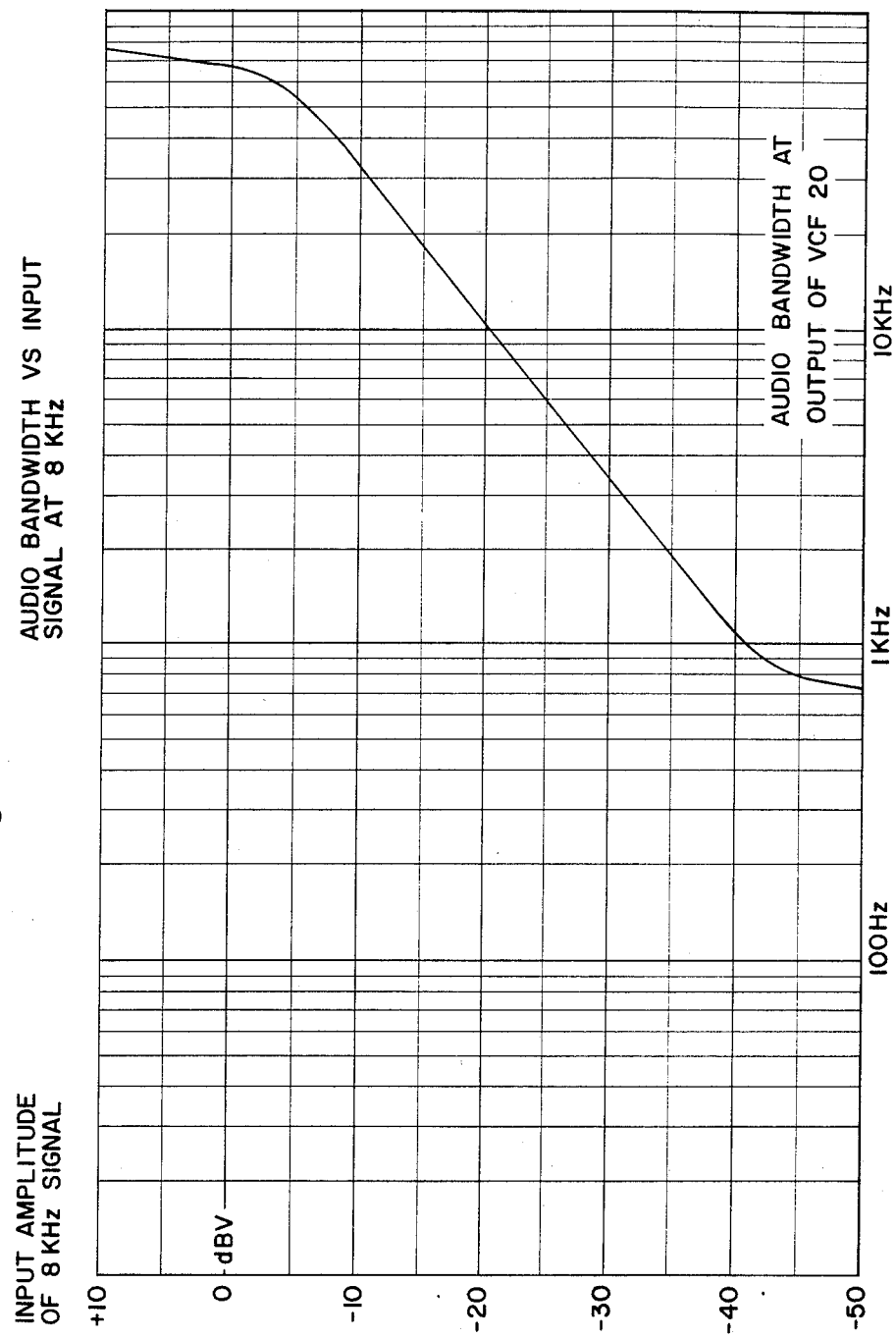

NOISE REDUCTION SYSTEM

This application is a continuation of application Ser. No. 460,319, filed Jan. 24, 1983.

TECHNICAL FIELD

This invention relates to noise reduction systems and more particularly to an improved, single-ended (non-complementary or non-encode/decode) noise reduction system for the removal of unwanted noise present in an audio signal, or in the absence of an audio signal, in a psychoacoustically acceptable manner.

BACKGROUND ART

Noise reduction systems similar to the type described in U.S. Pat. No. 3,789,143, issued to David E. Blackmer on Jan. 29, 1974, generally dynamically compress (encode) the signal prior to recording or trasmission, and dynamically expand the signal after transmission or upon playback. This type of noise reduction system is generally known as a "companding" (compress/expand) system. Systems which use the companding process do not remove noise present in the original signal, they only prevent additional noise from being added by the recording or transmission process. Assuming perfect processing, the processed output signal is identical to the original signal in signal content and unwanted noise.

Single-ended devices such as dynamic range expanders are sometimes used to reduce noise. Expanders similar to the type described in U.S. Pat. No. 4,177,356, issued to C. Rene Jaeger and Lawrence E. Blakely on Dec. 4, 1979, increase the level of loud musical passages (upward or positive expansion) and decrease the level of soft musical passages (downward or negative expansion). During downward expansion, the noise floor of the expanded output signal is reduced to a level below that of the original signal by an amount determined by the expansion ratio. The reverse is also true. During positive expansion, the noise floor of the expanded output signal may increase to a level above the noise floor level in the original signal or source of the original signal. The larger the expansion ratio, the more the noise floor will be reduced during downward expansion. Large expansion ratios may result in undesirable noise modulation of the noise floor and any other unwanted noise that may coexist with the original signal under full expansion processing. The expansion ratio is, therefore, kept typically small allowing the noise floor of the expanded output signal to be only slightly reduced from the noise floor of the original signal when the original signal is either low in amplitude (soft) or nonexistent. The use of dynamic range expanders to reduce noise primarily affects only the noise floor of the input signal and cannot remove other unwanted noise present in the input signal. In addition, the original signal will be expanded. This increase in dynamic range in many applications may be undesirable. In broadcasting, for instance, most material will be compressed without being part of a companding process to limit the dynamic range before transmission. Limiting the dynamic range in broadcasting makes the station appear louder to its listening audience by providing a stonger, easier-to-find signal. Compression will increase the level of the noise floor from the original signal or source of the original signal to a more noticeable level. In addition, other unwanted noise present in the original signal will be more pronounced.

Another type of single-ended noise reduction system is a dynamically variable (program dependent) low pass filter. This type of noise reduction system can actually reduce the level of noise unavoidably present in the program material by dynamically restricting the system bandwidth to the bandwidth required to pass the program material. At very low input signal levels or with no input signal, the bandwidth may be reduced to 1 KHz or less. Devices of this type are typically limited in the amount of signal-to-noise (S/N) improvement that can be realized. They do provide dynamic range integrity between the processed output and the unprocessed input but offer little better than 14 db of S/N improvement.

DISCLOSURE OF INVENTION

It is, therefore, an object of the present invention to provide an improved, single-ended noise reduction system capable of reducing unwanted noise present in an audio signal, or in the absence of an audio signal while maintaining dynamic range integrity to most, if not all audible levels in a psychoacoustically acceptable manner regardless of any prior type of processing by any one of a variety of nonlinear amplifying techniques.

Another object of the present invention is to provide an improved single-ended noise reduction system in which dynamic range integrity is maintained between the noise-reduced output and the original input for all input signal levels above a predetermined threshold level whereby when the original signal decreases in amplitude below this threshold level, downward expansion begins at an increasing range as the original signal decreases toward the noise floor of the original signal or the source of the original signal.

Another object of the present invention is to provide an improved single-ended noise reduction system whereby the bandwidth of the noise reduction system is varied in accordance with the original signal to further reduce noise while minimizing the effect known as "breathing" and other forms of noise modulation.

And another object of the present invention is to provide an improved single-ended noise reduction system which minimizes the loss of ambient or reverberant information.

Still another object of the present invention is to provide an improved single-ended noise reduction system in which alteration to the timbre of the program information is minimized.

These and other objects of the present invention are provided by an improved single-ended noise reduction system for the removal of unwanted noise present in an audio signal, or in the absence of an audio signal, in a psychoacoustically acceptable manner regardless of any prior type of processing by any one of a variety of nonlinear amplifying techniques. The preferred system also employs means to minimize noise modulation including the minimization of the effects known as "pumping" and "breathing." The preferred system also comprises means for minimizing the loss of ambient or reverberant information. The preferred system also includes means for minimizing alterations to the timbre of the program information.

A noise reduction system according to the present invention includes a signal path between an input terminal and an output terminal with amplification means interposed in the signal path for amplifying an audio frequency electrical signal by gain variable responsively to a control signal. A control path connects the input terminal with the amplification means for providing the control signal. A nonlinear element is interposed in the control path which causes the amount of gain reduction of the amplification means to increase at a faster rate than the audio frequency electrical signal decreases.

In one arrangement, a signal level detection means is interposed in the control path between the input terminal and the nonlinear element. The output of the signal level detection means is related to the signal level of the audio frequency electrical signal. In such an arrangement, a preferred form of the nonlinear element is a signal squaring means.

In one arrangement, a one pole high pass filter is interposed in the control path between the input terminal and the signal level detection means, and a direct current level shifter is interposed in the control path between the nonlinear element and the signal level detection means. A precision diode is connected between the direct current level shifter and the signal squaring means. The signal level detection means is preferably a root-mean-square voltage level sensor in this case.

In another embodiment of the present invention, a low pass filter is interposed in the signal path between the input terminal and the amplification means. The low pass filter rejects frequencies higher than a bandwidth which is variable responsively to a control signal. A weighting control path is between the input terminal and the low pass filter for providing the control signal to the low pass filter.

In another arrangement, a two pole high pass filter is interposed in the weighting control path, and a peak signal level detection means is interposed in the weighting control path between the two pole high pass filter and the low pass filter.

BRIEF DESCRIPTION OF THE DRAWING

For a fuller understanding of the nature and objectives of the present invention, reference should be made to the following detailed description taken in connection with the drawings wherein:

FIG. 3 is a chart as a function of input level of information at various points in the noise reduction system of FIG. 1; and FIG. 4 is a graph of the bandwidth of the noise reduction system of FIG. 1 versus different input signal levels at an input frequency of 8 KHz.

BEST MODE FOR CARRYING OUT THE INVENTION

Figure 1:
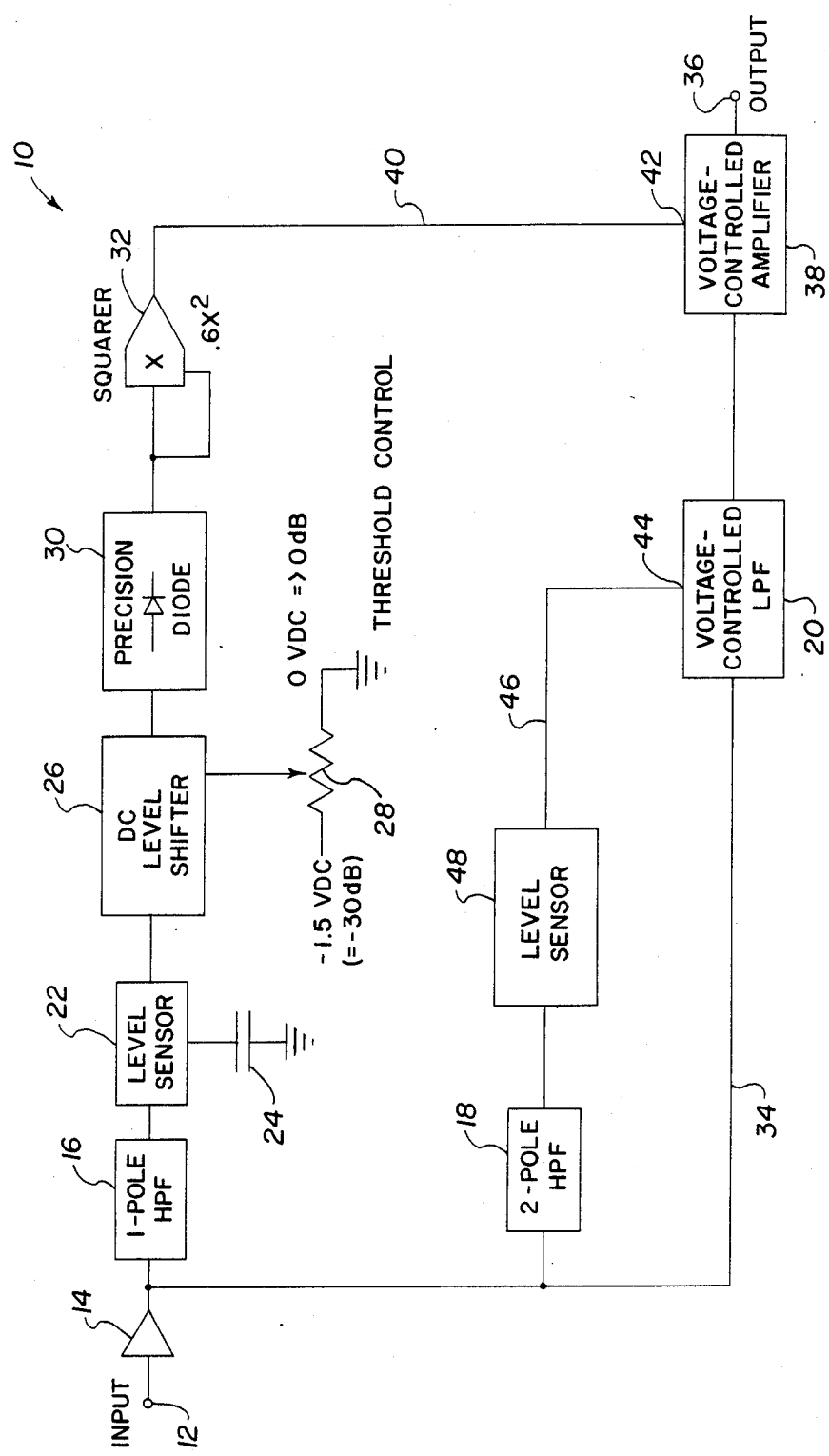
FIG. 1 is a block diagram of the preferred embodiment of the single-ended noise reduction system incorporating the principles of the present invention.

Referring now to the drawing and in particular to FIG. 1, a noise reduction system according to the present invention is referred to generally by reference numeral 10. An input terminal 12 is connected to a buffer or amplifier 14 for amplifying and shaping the audio signal in a manner well known to those skilled in the art. Further, buffer 14 acts as a bandpass filter capable of passing the frequency bandwidth of interest. For most audio signals, this bandwidth is between 20 Hz and 20 KHz. Buffer 14, in turn, has its output connected to means for disbursing the audio signal output to filters 16, 18 and 20. Preferably, the first filter 16 is a one-pole, high pass filter having a 3 dB cutoff at 100 Hz. This filter corrects the response of level sensor 22 at very low frequencies when the input signal applied to input terminal 12 is comprised predominately of low frequencies that are below the period chosen for the integration time as determined by integration capacitor 24 of level sensor 22. Filter 16, therefore, prevents level sensor 22 from reverting to peak detection due to increased ripple peaks at very low frequencies thereby minimizing the tendency for level sensor 22 to artificially boost the low frequency response. In addition, signal pumping and low frequency distortion are minimized resulting in an apparent flatness throughout the entire audio spectrum during intervals when the present invention begins expansion processing. Level sensor 22 includes means, preferably in the form of an RMS detector such as the one shown and described in the Blackmer patent, U.S. Pat. No. 3,681,618, for sensing the signal level from the output of buffer 14 as modified by filter 16, on a low-ripple or ripple-free basis so that the output of the detector means is linearly related to its input in decibels. Level sensor 22 also includes a charge storage device, integration capacitor 24, a control amplifier (not shown) for setting the gain change sense, in this case, expansion, and for providing a control signal output to a DC level sifter 26. It is significant that integration capacitor 24 provides an RMS response time or decrement rate of approximately 75 dB/sec at the reference input signal level applied to terminal 12. This further reduces pumping and low frequency distortion at very low input levels when the expansion ratios generated by the present invention are quite large.

The output of the level sensor 22 is connected to the input of the DC level shifter 26. Level shifter 26 simply adds a DC offset voltage to the control signal at the output of level sensor 22 and is controllable by variable resistor 28. The range of the DC offset voltage is not critical, and from a general applications point of view, a range from 0 VDC, corresponding to an input signal level applied to input terminal 12 of 0 dBv, to 1.5 VDC, corresponding to an input signal level applied to input terminal 12 of −30 dBv, seems most usable in general applications and thus will be the assumed range throughout the scope of the present invention.

The output of the level shifter 26 is connected to the input of the precision diode 30. Precision diode 30 allows the passage of all control signals from the output of level sensor 22 as modified by level shifter 26 that are greater than or equal to 0 VDC. Input signals applied to input terminals 12 that are above the corresponding DC voltage determined by variable resistor 28 appear as negative DC voltages at the input of precision diode 30. The output of precision diode 28 is, however, held constant at 0 VDC.

The output of precision diode 30 is connected to the input of the analog multiplier or squarer 32. Squarer 32 includes means to multiply its input signals by each other and means to scale its output by some constant k. To achieve the desired control voltage characteristic at the output of squarer 32, it is significant that k in the present invention be equal to 0.6 such that the transfer function of squarer 32 will be equal to 0.6X(X) (0.6 times the value of X squared) where X is the value of the control voltage at the output of precision diode 30 at any time. The value of k in the present invention in combination with the squaring function provided by squarer 32 provides for an increasing expansion ratio as the input signal applied to input terminal 12 decreases in level, below the corresponding input level determined by variable resistor 28, toward its noise floor or the noise floor of the source of the input signal applied to input terminal 12.

Noise reduction system 10 also includes a signal path 34 between input terminal 12 and an output terminal 36 for transmitting an audio frequency electrical signal. An amplification means 38 is interposed in signal path 34 for amplifying the audio frequency electrical signal by a gain which is variable responsively to a control signal. A control path 40 is between input terminal 12 and amplification means 38 for providing the control signal to the amplification means at the control terminal 42. In a preferred form, amplification means 38 is a voltage-controlled amplifier or attenuator.

When the gain of the voltage-controlled amplifier or attenuator 38 is greatly reduced, e.g., a large positive voltage present at the control voltage input 42 from the output of squarer 32, there is practically no output appearing at output terminal 36. The output of the VCA 38 is effectively cut-off. This cut-off and subsequent turn-on, upon the application of an input signal applied to terminal 12 or an increase in level of an input signal applied to terminal 12, is not discrete due to the action of the squarer 32. This provides an unnoticeable turn-on/turn-off characteristic resulting in extremely smooth gain changes even when the expansion ratios are quite large. When VCA 38 is cut-off, the output noise appearing at output terminal 36 is nearly unmeasurable corresponding to −90 dBm or less (Ref: 0 dBm output=0.775 vrms across 600 ohms).

Low pass filter 20 is interposed in signal path 34 between input terminal 12 and voltage control amplifier 38. Low pass filter 20 rejects frequencies higher than a bandwidth which is variably responsive to a control signal at control terminal 44. A weighting control path 46 is between input terminal 12 and low pass filter 20 for providing a control signal to the low pass filter at control terminal 44. Two-pole high pass filter 18 is interposed in weighting control path 46, and a peak signal level detection means 48 is interposed in weighting control path 46 between two-pole high pass filter 18 and low pass filter 20.

Figure 2:
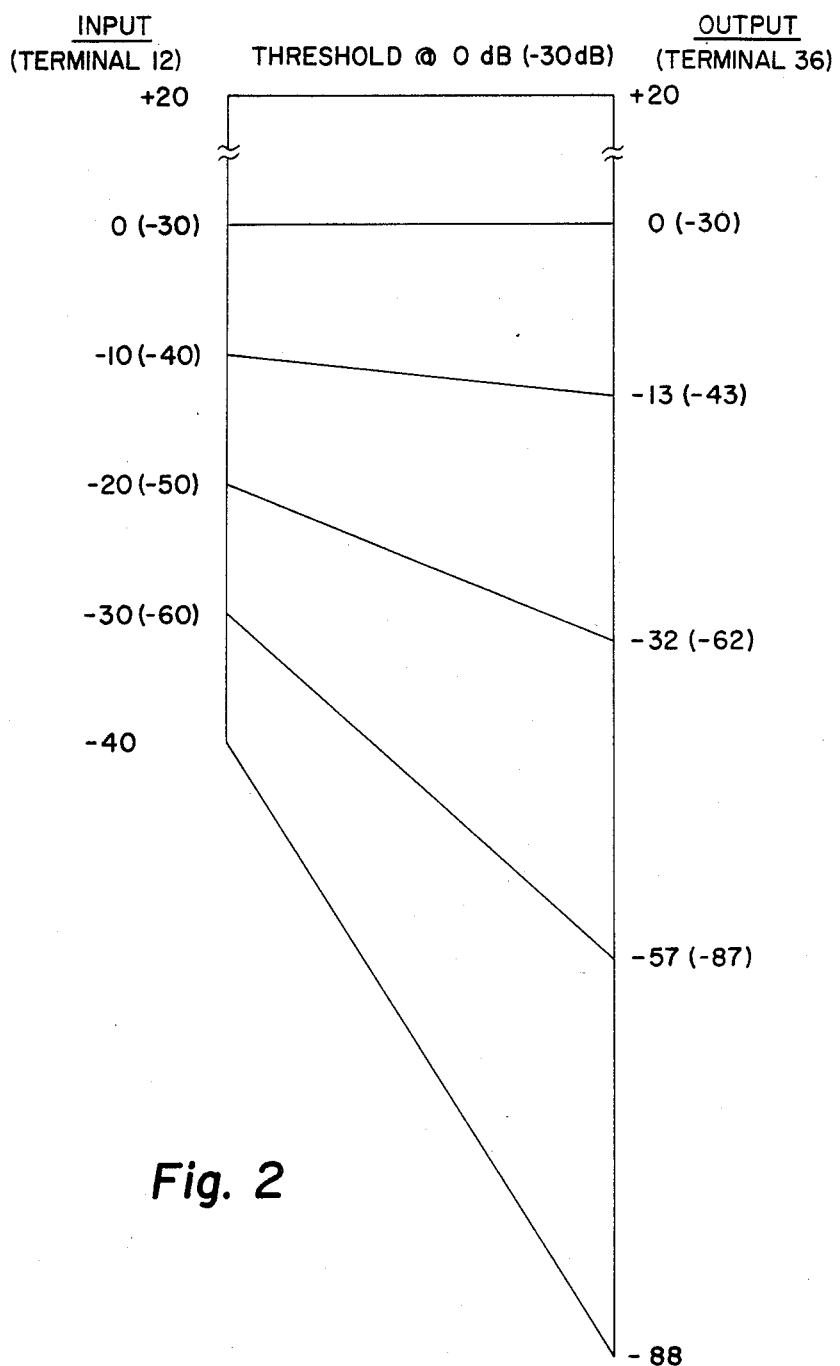
FIG. 2 is a chart indicating the corresponding output levels for different input levels applied to the input of the noise reduction system of FIG. 1.

Referring to FIG. 2, a signal applied to input terminal 12 at any level from 0 dBv input reference level to the full output capability of system 10 is transferred through the present invention to output terminal 36 with no change in level, i.e., the dynamic range integrity is maintained. With the threshold control set at 0 dB, corresponding to an input signal level of 0 dBv applied to terminal 12, the output level at terminal 36 decreases from 0 dBm to −13 dBm as the input signal decreases from 0 dBv to −10 dBv. This action corresponds to an expansion ratio of 1.3. As the input signal decreases from −10 to −20, the corresponding output changes will reflect an expansion ratio of 1.9. For a 10 dB drop in input level between the range of −30 to −40, the output level will drop to −88 dBm corresponding to an expansion ratio of 3.1. This is a large expansion ratio. Most of the companding systems operate on a 2:1 compression ratio and a 1:2 expansion ratio over the entire audio range. However, the present invention begins to expand, only slightly at first, as the input signal applied to terminal 12 decreases just below the threshold setting and greatly expands as the input signal approaches −40 dBv. This may seem too soon for some, but some broadcast signal sources have or are made to have minimal dynamic range. However, for wider dynamic range material, a threshold control variable resistor 28 setting of −30 dB (1.5 VDC when referring to FIG. 1) delays the expansion process until the input signal applied to terminal 12 decreases from −30 dBv to −40 dBv resulting in only slight expansion for this low range of input signal level while still providing large amounts of expansion for lower input signal levels which may be now approaching their noise floor or the noise floor of the source of the input signal. An input signal level of −60 dBv applied to terminal 12 is appearing at output 36 at a level of −87 dBm. This type of processing employed by the present invention greatly reduces noise in input signals which have breaks or pauses.

In addition, the large expansion ratios, which might be noticeable at higher input levels, occur mostly at inaudible levels relative to normal listening levels.

Voltage-controlled amplifier (VCA) 38 has a gain change characteristic of −20 dB/volt with unity gain occurring whenever 0 VDC is applied to its control voltage input 42. Simply stated, for each positive volt appearing at the control voltage input 42, the gain of VCA 38 is decreased by 20 dB and its gain is 1 (unity) when the control voltage from the output of squarer 32 is equal to 0 VDC.

Referring to FIG. 3A and FIG. 1, an input signal level of 0 dBv applied to input terminal 12 produces a corresponding voltage of 0 VDC at the output of level sensor 22. This appears at the input of level shifter 26. In this case, the wiper of the threshold control 28 is at the −30 dB position corresponding to −1.5 VDC. With 0 VDC applied to the input of level shifter 26, its output will be shifted by 1.5 VDC to −1.5 VDC. Precision diode 30 now has −1.5 VDC appearing at its input, but due to its action, it clamps this voltage to 0 VDC at its output and applies this voltage to the inputs of the squarer 32. Squarer 32 processes the voltage appearing at its inputs in accordance with its transfer function and produces an output of 0 VDC which is applied to the control voltage input 42 of VCA 38. Since the gain of VCA 38 is 1, the output signal appearing at output terminal 36 is equal to the level of the input applied to input terminal 12.

Again referring to FIGS. 3A and 1, an input signal level of −40 dBv applied to input terminal 12 results in a corresponding voltage of +2.0 VDC at the output of the level sensor 22. Level shifter 22 shifts this voltage producing an output of +0.5 VDC to be applied to the input of precision diode 30. Since this voltage is greater than or equal to 0 VDC, it is passed by precision diode 30 directly to the inputs of squarer 32. When processed by squarer 32 in accordance with its transfer function (0.6*x*x), squarer 32 produces an output voltage of +0.15 VDC that is applied to the control voltage input 42 of VCA 38. This results in a 3 dB gain reduction in VCA 38 producing a corresponding output signal level at output terminal 36 of −43 dBm. Following the same sequence of events for an input signal level of −50 dBv applied to input terminal 12 results in a further gain reduction 12 dB in VCA 38 producing an output level of −62 dBv. The amount of gain reduction has increased as the input signal level has decreased toward its noise floor. The noise floor of most signals or sources which would require the use of noise reduction probably have signal-to-noise ratios of noise reduction probably have signal-to-noise ratios of −50 to −60 dBv or worse. In FIG. 3B, the levels and voltages can be traced through the same sequence as in the aforementioned, however, threshold control variable resistor 28 has its wiper in the 0 VDC position. In this case, there is no DC shift in level shifter 26, therefore, all voltages appearing at its input will be passed directly to precision diode 30.

Filter 18 is preferably a two-pole high pass filter with a 3 dB cut-off at 6.6 KHz. Filter 18 is a weighting filter with a response based on the CCIR noise weighting curve which represents the human ear's sensitivity to noise versus frequency. Noise in the 6 KHz region is the most objectionable noise. It can, however, be reduced by masking whenever the musical content of the input signal contains dominant frequencies in this same frequency range. The audio signal's bandwidth, therefore, must be controlled by the information present in the passband of filter 18 to insure that the amount of noise passed by the present invention is capable of being masked by the musical content of the input signal applied to input terminal 12.

The output of filter 18 is connected to level sensor 48. Level sensor 48 includes means to sense the signal level from the output of buffer 14 as modified by filter 18 so that the output of the detector means is related to its input. Level sensor 48 also includes a charge storage device (not shown) with means to produce the desired attack and decay times for the detected control signal, and means to output the control signal from the output of level sensor 48 to the control voltage input 44 of the voltage-controlled filter (VCF) 20.

VCF 20 is preferably a single-pole, voltage-controlled low pass filter whose 3 dB point varies in proportion to the amount of control voltage present at its control voltage input 44. In the embodiment illustrated, the bandwidth (3 dB cut-off) varies from approximately 800 Hz to greater than 20 kHz. Since level sensor 48 ultimately varies the bandwidth of the audio signal applied to input terminal 12, the times required to open and close the bandwidth are important. The attack time, the time required to open the bandwidth in the present invention to greater than 20 kHz, should be 1 mSec so as to have no audible effect on musical transients. In addition, this attack time is long enough to disallow narrow spikes or ticks that may appear in certain sources such as phonograph records to actuate level sensor 48. This further aids in the noise reduction process by keeping the bandwidth minimized to all but the musical content of the audio signal applied to input terminal 12. The decay time of level sensor 48 should be 50 mSec (to within 10% of the final value). This decay time is long enough to not interfere appreciably with ambient or reverberant information, but short enough to prevent noise from being heard, at output terminal 36 between notes or after pauses in the program material applied to input terminal 12.

High frequency noise such as tape hiss will cause an apparent increase in high frequency signal content due to the support the noise provides for the signal. By removing the unwanted high frequency noise, an apparent loss of high frequency energy may be observed. This, however, is a psychoacoustic illusion and is common to all types of noise reduction systems. In the present invention this psychoacoustic effect is minimized by keeping the bandwidth wider than in other types of dynamically-variable filters used in noise reduction systems. The dynamically variable filter as used by the present invention is not the sole source of noise reduction processing. It aids in the noise reduction process by minimizing the bandwidth when necessary but always allows the passage of the input signal (and its harmonics) at higher signal levels while tracking the ears response to high frequency energy as the input signal level applied to input terminal 12 decreases. In addition, the dynamically-variable filter as used in the present invention minimized noise modulation that may occur due to the large expansion ratios used at low levels in the expansion portion of the present invention.

Referring to FIG. 4, a nominal input signal level at 8 kHz of 0 dBv applied to input terminal 12 yields a bandwidth in excess of 60 kHz. As the input signal level decreases to −20 dBv, the bandwidth is still in excess of 10 kHz. As normal listening volumes decrease, the ear becomes less sensitive to higher frequencies. This is a normal characteristic of human hearing and, in the case of the present invention, the bandwidth is varied in accordance with the ears response. At an input level of −40 dBv, the bandwidth is slightly greater than 1 kHz.

The signal output of VCF 20 is connected to the signal input of the VCA 38. The signal output of VCA 38 is connected to output terminal 36.

Although the present invention has been described in accordance with the preferred embodiment, it will be evident that various modifications can be made without departing from the scope of the invention. For example, the system shown can be used to reduce noise on stereophonic signals. In such a situation, the two paths containing level sensors 22 and 48 could be sensing the sum of the L and R channels in a stereophonic application. Further, although each sensing path is shown as a feed forward loop, i.e. the information signals are sensed at the output of the corresponding filters, a feedback loop can also be used by deriving the particular control signal for each voltage-controlled module from the output of the particular voltage-controlled module. Although the system is shown as comprising one signal path and two sensing paths for expanding and varying the bandwidth of the input signal, the signal could be divided into any number of substantially descrete frequency bands for sensing and expanding with each being expanded in its own signal path by a control signal derived along a corresponding exclusive level sensing path. In addition, the signal would be divided into a plurality of descrete frequency bands for sensing and filtering with each being filtered in its own signal path by a control signal derived along a corresponding exclusive level sensing path.

The above system has several advantages. For one thing, no encoding of any type is required. Further, large amounts of noise reduction can be realized with minimal apparent affect on the input signal. The time constants in the sensing paths minimize all types of noise modulation and the loss of ambient or reverberant information due to the expanding or filtering process. Filter 16 minimizes low frequency distortion and pumping by compensation for possible peak reversion at low frequencies in level sensor 22. Also the dynamic range integrity is maintained for all signal levels above the threshold setting determined by threshold control 28 and level shifter 26. A preferred system also uses the more psychoacoustically acceptable technique of RMS signal detection as compared to peak or averaging detection. Squarer 32 provides a smooth mathematical expansion curve for transitional smoothness from no expansion to full expansion and in reverse. In addition, filters 16 and 18 prevent alteration to the timbre of the signal information as a result of expanding and filtering the signal. Finally, the use of a slow decrement rate in the expansion sensing path allows a very long smoothing constant to be applied to the control voltage signal for steady state or slowly varying signals, thus adding very little distortion to the audio signal but still allowing for rapid changes in control voltage due to the action of squarer 32.

Since certain changes may be made in the above apparatus without departing from the scope of the invention herein involved, it is intended that all matter contained in the above description and shown in the accompanying drawings shall be interpreted in an illustrative and not in a limiting sense.

I claim:

1. A noise reduction system comprising in combination:
   an input terminal for receiving an electrical signal;
   an output terminal;
   a signal path between the input and output terminals for transmitting a signal representative of the electrical signal;
   amplification means interposed in the signal path for amplifying the electrical signal by a gain variable responsively to a control signal;
   a gain reduction control path between the input terminal and the amplification means for providing the control signal to the amplification means;
   a nonlinear element interposed in the control path wherein the amount of gain reduction to the amplification means increases at a faster rate than the electrical signal decreases;
   a low pass filter interposed in the signal path between the input terminal and the amplification means, for rejecting frequencies higher than a bandwidth variable responsively to a control signal; and
   a weighting control path between the input terminal and the low pass filter for providing the control signal to the low pass filter.

2. A noise reduction system according to claim 1, further comprising signal level detection means interposed in the gain reduction control path between the input terminal and the nonlinear element, the output of which is related to the signal level of the electrical signal, wherein the nonlinear element comprises a signal squaring means.

3. A noise reduction system according to claim 2, further comprising:
   a one pole high pass filter interposed in the gain reduction control path between the input terminal and the signal level detection means; and
   a direct current level shifter interposed in the control path between the signal level detection means and the signal squaring means.

4. A noise reduction system according to claim 3, further comprising a precision diode interposed in the gain reduction control path between the direct current level shifter and the signal squaring means, wherein the signal level detection means is a root-mean-square voltage level sensor.

5. A noise reduction system according to claim 4, further comprising:
   a two pole high pass filter interposed in the weighting control path; and
   a peak signal level detection means interposed in the weighting control path between the two pole high pass filter and the low pass filter.

6. A noise reduction system according to claim 1, further comprising:
   a two pole high pass filter interposed in the weighting control path; and
   a peak signal level detection means interposed in the weighting control path between the two pole high pass filter and the low pass filter.

7. A noise reduction system according to claim 1, further comprising:
   a high pass filter interposed in the weighting control path; and
   a peak signal level detection means interposed in the weighting control path between the high pass filter and the low pass filter.

8. A noise reduction system comprising in combination;
   an input terminal for receiving an electrical signal;
   an output terminal;
   a signal path between the input and output terminals for transmitting a signal representative of the electrical signal;
   variable amplification means interposed in the signal path for amplifying the electrical signal responsively to a control signal;
   a first control path between the input terminal and the amplification means for providing the control signal to the amplification means;
   means interposed in the first control path for providing an output signal which is its input signal raised to at least the second power and multiplied by a constant;
   filter means interposed in the signal path for rejecting frequencies outside a bandwidth which is variably responsive to a control signal; and
   a second control path between the input terminal and the filter means for providing the control signal to the filter means.

9. A noise reduction system according to claim 8, further comprising signal level detection means interposed in the first control path, the output of which is related to the signal level of the electrical signal.

10. A noise reduction system according to claim 9, further comprising:
    a high pass filter interposed in the first control path between the input terminal and the signal level detection means.

11. A noise reduction system according to claim 10 wherein the high pass filter is a single pole high pass filter.

12. A noise reduction system according to claim 9, wherein the signal level detection means comprises a root-mean-square voltage level sensor.

13. A noise reduction system according to claim 9, further comprising a variable direct current level shifter interposed in the first control path between the signal level detection means and the variable amplification means.

14. A noise reduction system according to claim 13, further comprising a precision diode interposed in the first control path between the level shifter and the amplification means, which substantially limits current flow of the control signal to values of only one polarity.

15. A noise reduction system according to claim 13 wherein the first-mentioned means interposed in the first control path is coupled between the variable direct current level shifter and the variable amplification means comprises means for providing an output signal which is its input signal squared and multiplied by approximately 0.6.

16. A noise reduction system according to claim 8 wherein the filter means comprises a low pass filter for rejecting frequencies higher than a bandwidth variable responsively to the control signal from the second control path.

17. A noise reduction system according to claim 16 further comprising:
a high pass filter interposed in the second control path; and
level sensing means interposed in the second control path between the high pass filter and the low pass filter.

18. A noise reduction system according to claim 17 wherein the high pass filter interposed in the second control path is a two pole high pass filter.

19. A noise reduction system according to claim 18 wherein the level sensing means interposed in the second control path is a peak signal level detection means.

* * * * *

UNITED STATES PATENT AND TRADEMARK OFFICE
CERTIFICATE OF CORRECTION

PATENT NO. : 4,609,878
DATED : September 2, 1986
INVENTOR(S) : Robert L. Rodgers It is certified that error appears in the above-identified patent and that said Letters Patent is hereby corrected as shown below:

In Col. 2, line 34, "range" should read ---rate---

In Col. 8, line 43, "would" should read ---could---

In Col. 9, line 28, "to" should read ---of---

Signed and Sealed this

Fourth Day of November, 1986

[SEAL]

*Attest:*

DONALD J. QUIGG

*Attesting Officer*   Commissioner of Patents and Trademarks